United States Patent [19]

Gingrich et al.

[11] Patent Number: 5,175,508
[45] Date of Patent: Dec. 29, 1992

[54] VOLTAGE-CONTROLLED AMPLIFIER USING OPERATIONAL AMPLIFIER

[75] Inventors: Randal R. Gingrich, Belleville; Nicholas L. Difiore, Farmington Hills; Max H. Behrens, Plymouth, all of Mich.

[73] Assignee: Ford Motor Company, Dearborn, Mich.

[21] Appl. No.: 802,686

[22] Filed: Dec. 5, 1991

[51] Int. Cl.[5] .......................... H03F 3/08; H03G 3/20
[52] U.S. Cl. ........................................ 330/84; 330/86; 330/282; 330/295
[58] Field of Search ............... 330/84, 86, 124 R, 144, 330/145, 282, 283, 284, 295

[56] References Cited

U.S. PATENT DOCUMENTS

| | | | |
|---|---|---|---|
| 3,539,936 | 11/1970 | McGhee | 330/86 |
| 3,581,223 | 5/1971 | Armstrong | 330/86 |
| 3,652,791 | 3/1972 | Shuey | 178/7.1 R |
| 3,679,986 | 7/1972 | Zaman, III | 330/86 |
| 3,860,883 | 1/1975 | Bernin | 330/86 |
| 3,868,948 | 3/1975 | Graetz | 330/282 X |
| 4,070,632 | 1/1978 | Tuttle | 330/86 |
| 4,181,896 | 1/1980 | Schroder | 330/282 |

FOREIGN PATENT DOCUMENTS 300608 12/1989 Japan ................................ 330/283
2071945 9/1981 United Kingdom .............. 330/284

OTHER PUBLICATIONS

A Linear Multiple Gain-Controlled Amplifier, Nat'l Semiconductor Appln. Note 129, J. Sherwin, Aug. 1975, pp. 11-38 — 11-45.
Reducing Distortion in Controlled Attenuators Using FET, Proceedings of the IEEE, Oct. 1968, pp. 1718-1719.
The Art of Electronics, P. Horowitz and W. Hill, Cambridge University Press, pp. 122-124.

Primary Examiner—James B. Mullins
Attorney, Agent, or Firm—Mark Mollon; Roger L. May

[57] ABSTRACT

A voltage-controlled amplifier employs an operational amplifier with negative feedback for setting the gain. A voltage variable resistance such as a junction-field-effect transistor (JFET) is employed as part of a variable voltage divider for controlling the amplifier gain. Resistors in series and in parallel with the JFET determine minimum and maximum resistances corresponding to upper and lower limits for the amplifier gain. Thus, multiple channels of an amplifier can be provided with closely matched characteristics even using separate JFETs in each separate channel which have unmatched characteristics.

3 Claims, 3 Drawing Sheets

VOLTAGE-CONTROLLED AMPLIFIER USING OPERATIONAL AMPLIFIER

CROSS-REFERENCE TO RELATED APPLICATION

This application is related to commonly assigned application Serial No. 07/802,590, now U.S. Pat. No. 5,138,280 filed concurrently herewith and entitled "Multichannel Amplifier With Gain Matching", which is incorporated herein by reference.

BACKGROUND OF THE INVENTION

The present invention relates in general to a voltage-controlled amplifier (VCA) having a minimum gain value and a maximum gain value set to any selected values by fixed resistors, and more specifically, to a gain-matched multichannel audio amplifier wherein each channel employs a JFET in the feedback loop of an operational amplifier.

Amplification of electrical signals by a desired gain can be achieved using operational amplifier (op amp) integrated circuits. By providing negative feedback between the output of the op amp and its inverting input, the gain provided by such an amplifier is controlled by external resistances connected to the op amp as is known in the art. If one or more of the external resistances are variable resistances, the amplifier gain may be varied. Thus, a variable-gain amplifier can be realized by employing a potentiometer in the feedback path between the output and inverting input of the op amp, for example.

It is also known to employ a voltage-controlled attenuator such as a junction field-effect transistor (JFET) operating in its linear or triode region of operation as a variable gain-setting resistance used in conjunction with an op amp. Thus, a gate control voltage supplied to the JFET determines the amplifier gain. However, several disadvantages are associated with certain inherent properties of JFETs. Due to uncontrollable variations in the fabrication process of JFETs, various electrical properties, such as pinch-off voltage $V_p$, on-resistance $R_{ds(on)}$, and the resistance curve between $R_{ds(on)}$ and $V_p$, have a wide variation from one JFET to another JFET of the same design. The use of a JFET as a voltage-controlled attenuator is strongly influenced by these uncontrolled characteristics, thus limiting the usefulness of JFETs as attenuators. Testing of JFETs after manufacture to sort them according to similar characteristics greatly increase the costs associated with using JFETs as attenuators. Furthermore, sorting cannot eliminate all variability in the JFET characteristics.

Variations in the electrical properties of JFETs create problems if JFET-controlled op amps are to be used in multichannel audio amplifiers (e.g., audio limiters) which require that separate channel gains closely track each other. Even sorted JFETs do not provide sufficiently matched characteristics to obtain the required gain tracking.

In order to improve the characteristics of an amplifier using a JFET in the feedback path of an op amp, a fixed resistor may be combined in parallel with the JFET. For example, in an Application Note 125 from National Semiconductor Corporation, an op amp gain control circuit is shown which employs a fixed resistor connected in parallel with a JFET in order to get a minimum gain value independent of the JFET characteristics. The application note teaches that gain tracking between different amplifiers requires monolithic dual or quad JFETs. However, the use of discrete JFETs may often be preferred because of lower price, flexibility in packaging (i.e., several smaller JFETs rather than one larger one), and the fact that even the best monolithic dual or quad JFETs exhibit variation in pinch-off voltage of a few tenths of a volt (which is enough to cause serious mismatching in a multichannel amplifier).

In a multichannel audio amplifier, it would be desirable to match all the minimum and maximum gains at fixed values independent of the JFET characteristics in order to prevent errors in stereo imaging. But even using dual or quad JFETs as suggested in the Application Note 125, the maximum gain is uncontrolled. The gate control signal would have to be precisely controlled so that the desired amount of gain would be obtained and so that a maximum desired gain is not exceeded. However, the precise voltage to be generated cannot be known in advance because of the uncertainty of the actual resistance curve of a particular dual or quad JFET. Thus, prior art amplifiers employing JFET controlled op amps perform in unpredictable ways, making them unsuitable for various applications such as a multichannel audio limiter.

SUMMARY OF THE INVENTION

It is the principal object of the present invention to provide a multichannel voltage-controlled amplifier with separate gains which track within precise limits in response to a common control voltage.

It is another object of the present invention to employ JFETs in the feedback path of an operational amplifier to control gain between the minimum and maximum gain values without introducing distortion or errors in stereo imaging and without requiring a precisely generated control voltage.

It is further object of the present invention to provide an improved audio apparatus having a multichannel limiter normally providing its maximum gain and which is responsive to a control signal to reduce gain by an amount necessary to prevent clipping distortion in the power amplifier stage of the audio apparatus.

These and other objects are achieved in an amplification circuit for amplifying an electrical signal according to a variable gain between first and second gains which comprises an operational amplifier having an inverting input, a noninverting input, and an output. A variable voltage divider is coupled to the inverting input and the output which includes a fixed resistance branch and a variable resistance branch. The variable resistance branch includes a first fixed resistance connected in parallel with the series combination of a second fixed resistance and a voltage-controlled resistance, such as a JFET. The variable resistance branch has a total resistance which is variable between a minimum resistance and a maximum resistance corresponding to the first gain and the second gain, respectively.

BRIEF DESCRIPTION OF THE DRAWINGS

The novel features of the invention are set forth with particularity in the appended claims. The invention itself, however, both as to its organization and method of operation together with further objects and advantages thereof, may best be understood by reference to the following description taken in conjunction with the accompanying drawings in which:

DETAILED DESCRIPTION OF PREFERRED EMBODIMENTS

Figure 1:
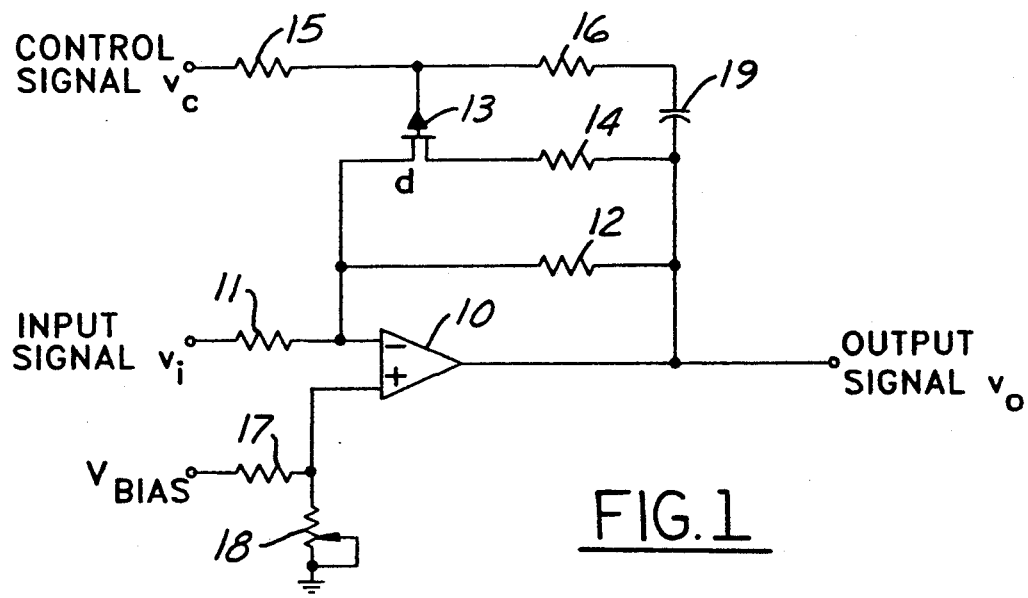
FIG. 1 is a schematic diagram of an inverting amplifier according to the Present invention.

FIG. 1 shows an op amp 10 having an inverting input, noninverting input, and an output. The output provides an output signal $v_o$. An input signal $v_i$ is coupled to the inverting input through the resistor 11. The inverting input and the output are interconnected for negative feedback through a resistor 12 which is connected in parallel with the series connection of a JFET 13 and a resistor 14. The drain terminal of JFET 13 is connected to the inverting input of op amp 10, and the source terminal is connected to resistor 14. A control signal $v_c$ is coupled to the gate terminal of JFET 13 through a resistor 15. The gate terminal and the source terminal are coupled together through a resistor 16 and resistor 14. A capacitor 19 isolates control signal $v_c$ from output signal $v_o$.

FIG. 1 also shows a bias circuit connected to a DC bias voltage $V_{BIAS}$ which is applied to a voltage divider including a resistor 17 and a variable resistor 18. The junction of resistors 17 and 18 is connected to the noninverting input of op amp 10. Thus, op amp 10 is biased for AC operation with a single-ended power supply. The bias voltage applied to the noninverting input can be adjusted in response to the actual pinch-off voltage of JFET 13 as is described in concurrently filed U.S. patent application Ser. No. 07/802,590, now U.S. Pat. No. 5,138,280 which is incorporated herein by reference in its entirety. Alternatively, a split level power supply could be used and the noninverting input provided with an adjustable bias voltage by coupling it to both supply voltages through respective variable resistors.

In operation, the amplifier of FIG. 1 provides gain between a minimum gain and a maximum gain determined by the resistance values of resistors 11, 12, and 14 and substantially independent of the characteristics of JFET 13. More specifically, resistor 11, 12, and 14 and JFET 13 form a variable voltage divider between input signal $v_i$ and output signal $v_o$, with resistor 11 forming a fixed resistance branch and resistors 12 and 14 and JFET 13 forming a variable resistance branch. The inverting amplifier of FIG. 1 has a gain determined by the ratio of the total resistance between the inverting input and the output to the resistance between input signal $v_i$ and the inverting input. When control signal $v_c$ is greater than $V_p$ (the pinch-off voltage of JFET 13), the resistance $R_{ds}$ of JFET 13 is infinite and the total resistance of the variable resistance branch is at its maximum (i.e., the resistance of resistor 12). Consequently, the amplifier gain is at its maximum value, given by the formula:

$$G_{max} = v_o/v_i = -R12/R11$$

where $G_{max}$ is the maximum gain and R11 and R12 are the resistance values of resistors 11 and 12, respectively.

As the voltage of control signal $v_c$ is reduced below pinch-off voltage $V_p$, the resistance of the channel of the JFET is reduced and the gain of the inverting amplifier is reduced as given by the formula:

$$G = -R12*(R_{ds}+R14)/((R11*(R_{ds}+R14+R12))$$

where $R_{ds}$ is the drain-to-source resistance of the JFET in its linear region and R14 is the resistance value of resistor 14. As the value of control signal $v_c$ is further reduced, JFET 13 reaches a fully turned-on state and the value of $R_{ds}$ reaches its minimum value of $R_{ds(on)}$. Preferably, the value of $R_{ds}$ is much, much less than R14, so that the minimum gain $G_{min}$ can be approximated by the formula:

$$G_{min} = -(R12*R14) / (R11*(R14+R12)).$$

Resistor 16 provides feedback between the gate and source of JFET 13 in order to increase the linear operating region of JFET 13. Resistors 15 and 16 have very high resistance values and may be about one megohm, for example.

Figure 2:
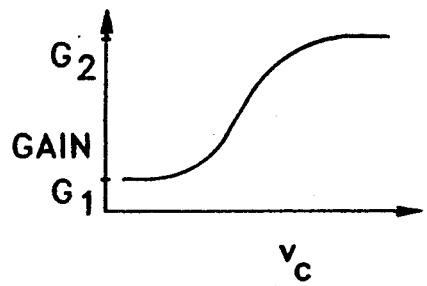
FIG. 2 is a plot of gain versus control voltage for the amplifier of FIG. 1.

FIG. 2 shows a gain curve according to the inverting amplifier of FIG. 1 wherein the gain varies between a first gain $G_1$ and a second gain $G_2$ which do not depend on any characteristics of the JFET. Gain $G_1$ corresponds to the minimum resistance of JFET 13 and gain $G_2$ corresponds to the maximum resistance of JFET 13. Thus, $G_1$ corresponds to the minimum gain and $G_2$ corresponds to the maximum gain for the amplifier configuration of FIG. 1, but $G_1$ and $G_2$ are reversed for other configurations discussed below. Furthermore, either $G_1$ or $G_2$ can be greater than or less than 1 (i.e., the amplifier may be amplifying or attenuating) depending on the particular resistance values employed.

Figure 3:
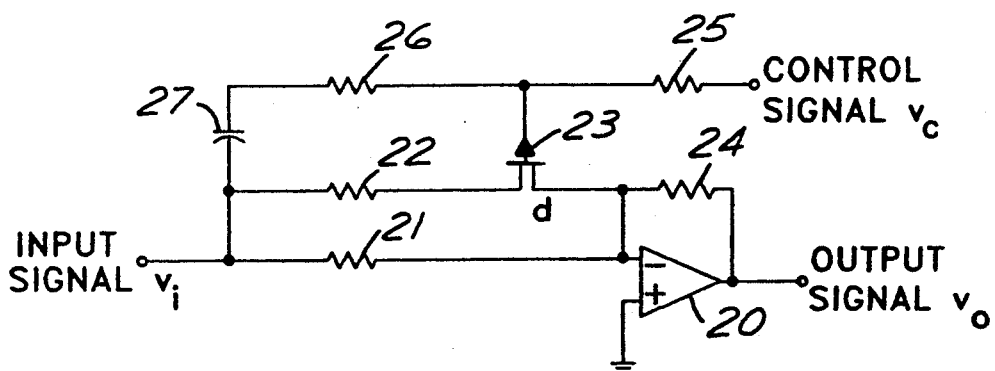
FIG. 3 is a schematic diagram of an alternative embodiment of an inverting amplifier according to the present invention.

FIG. 3 shows an alternative embodiment of an inverting amplifier wherein the variable resistance branch is located between an input terminal for input signal $v_i$ and the inverting input of the op amp and the fixed resistance branch provides negative feedback between the op amp output and the inverting input. Specifically, input signal $v_i$ is coupled to the inverting input of an op amp 20 through a resistor 21. A resistor 22 and a JFET 23 are connected in parallel with resistor 21. A resistor 24 is connected between the inverting input and the output of op amp 20. Output signal $v_o$ is provided from the op amp output. A control signal $v_c$ is provided to the gate of JFET 23 through a resistor 25. A resistor 26 has one end connected to the gate of JFET 23 and the other end connected to the source of JFET 23 through resistor 22. A capacitor 27 isolates control signal $v_c$ from input signal $v_i$.

When JFET 23 is fully on (i.e., control signal $v_c=0$), the total variable resistance between input signal $v_i$ and the inverting input of op amp 20 is at its minimum. The corresponding gain is at its maximum and since the JFET on-resistance $R_{ds(on)}$ is negligible compared to resistance R22 of resistor 22, the maximum gain $G_{max}$ is given by:

$$G_{max} = -R24*(R21+R22) / (R21*R22)$$

where R21, R22, and R24 are the resistances provided by resistors 21, 22 and 24. When control signal $v_c$ reaches the pinch-off voltage $V_p$ of JFET 23, the input resistance becomes a maximum and the output gain becomes a minimum $G_{min}$ given by:

$$G_{min} = -R24/R21.$$

Figure 4:
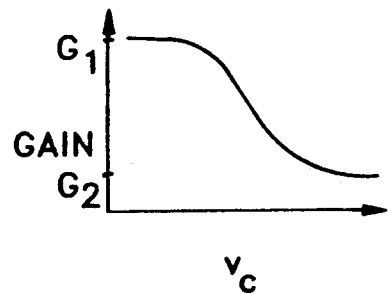
FIG. 4 is a plot of gain versus control voltage for the amplifier of FIG. 3.

As shown in FIG. 4, the resulting gain curve for the amplifier of FIG. 3 is flipped with respect to the gain curve of FIG. 2.

Since the circuit of FIG. 3 exhibits a variable input impedance, it is necessary to ensure that the circuit supplying input signal $v_i$ is capable of driving the variable load.

Figure 5:
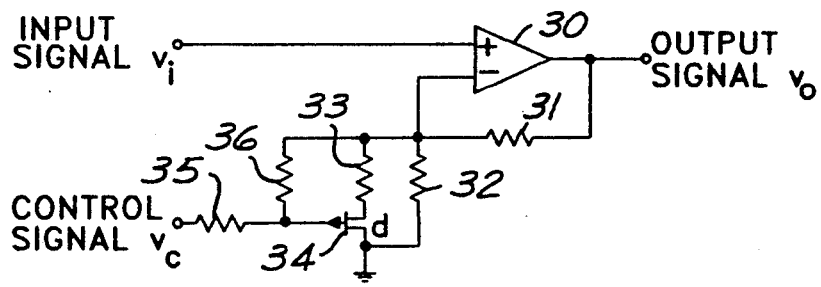
FIG. 5 is a schematic diagram of a noninverting amplifier according to the present invention.

FIG. 5 shows a noninverting amplifier configuration employing the present invention for controlling both the minimum and maximum gain of the amplifier using fixed resistors. A noninverting amplifier provides a gain greater than or equal to one which is set by external resistors such that the gain equals one plus the ratio of the negative feedback resistance between the inverting input and the output to the resistance between the inverting input and ground, as is well known in the art.

An op amp 30 has a fixed resistance branch comprising a resistor 31 connected between the inverting input and the output of op amp 30. A variable resistance branch connected between the inverting input and ground comprises a resistor 32 connected in parallel with a series combination of a resistor 33 and a JFET 34. A resistor 35 provides a control signal $v_c$ to the gate of JFET 34. A resistor 36 is coupled between the gate and source of JFET 34 to limit the gate to source voltage and thereby maintain the JFET in its triode or linear region of operation.

When control signal $v_c$ provides a voltage of substantially zero to the gate of JFET 34 causing JFET 34 to provide its minimum resistance, the amplifier provides a first gain (corresponding to its maximum gain) as follows:

$$G_{max} = 1 + (R31*(R32+R33) / (R32*R33)).$$

As control signal $v_c$ rises, the gain provided by the noninverting amplifier decreases until at pinch-off of JFET 34 a second gain is obtained (corresponding to the minimum gain) as defined by:

$$G_{min} = 1 + R31/R32.$$

Figure 6:
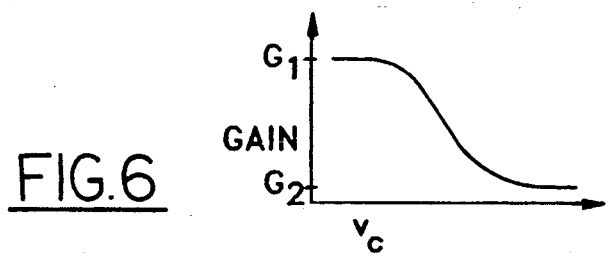
FIG. 6 is a plot of gain versus control voltage for the amplifier of FIG. 5.

FIG. 6 shows the resulting gain curve. Since this is a noninverting amplifier, both gains $G_1$ and $G_2$ are greater than one.

Figure 7:
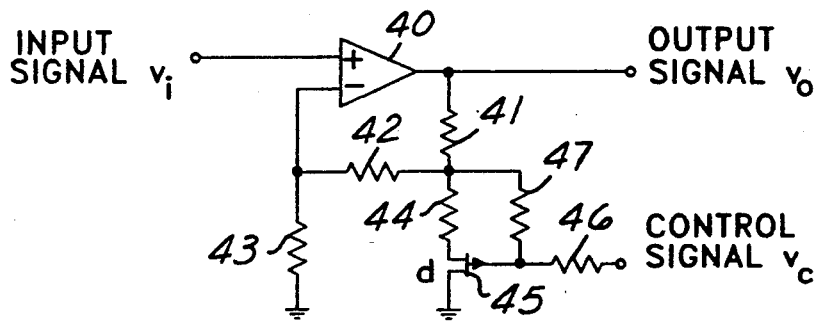
FIG. 7 is a schematic diagram of an alternative embodiment of a noninverting amplifier according to the present invention.
Figure 8:
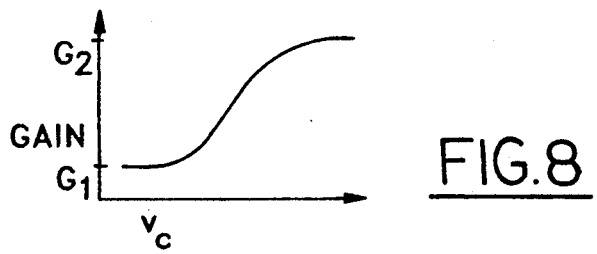
FIG. 8 is a plot of gain versus control voltage for the amplifier of FIG. 7.

As shown in FIG. 7, the noninverting amplifier configuration can also be obtained having the fixed resistance branch and the variable resistance branch switched with respect to the embodiment shown in FIG. 5. Thus, an op amp 40 receives input signal $v_i$ at its noninverting input and provides output signal $v_o$ at its output. A pair of resistors 41 and 42 are connected in series between the output and the inverting input of op amp 40. A resistor 43 couples the inverting input to ground. A variable resistance is provided between the output and the inverting input by connection of a resistor 44 and a JFET 45 from the junction of resistors 41 and 42 to ground. A resistor 47 is connected between the gate of JFET 45 and the junction of resistors 41 and 42. A control signal $v_c$ is provided to the gate through a resistor 46. When control signal $v_c$ is at its minimum value (e.g., zero volts), the resistance of JFET 45 is at its minimum and the amplifier provides a first gain corresponding to its minimum gain. The amplifier gain increases as control signal $v_c$ increases until the pinch-off voltage is reached and a second gain is obtained corresponding to the maximum gain. FIG. 8 shows the resulting gain curve for the noninverting amplifier of FIG. 7.

In each of the amplifier circuits of FIGS. 1, 3, 5, and 7, the drain terminal of the JFET is connected to maintain a fixed voltage by connecting it to ground or to one of the inputs to the op amp which is maintained at a virtual ground or at a fixed bias voltage. This prevents the gate-to-drain voltage from varying with the input signal which would otherwise disrupt the gain curve provided by the amplifier.

Although JFETs are shown in each amplifier configuration, it will clear to those skilled in the art that metal-oxide-semiconductor field-effect transistors (MOSFETs) or other voltage controlled attenuators could be employed. Furthermore, although each configuration is shown having one variable resistance branch and one fixed resistance branch, it will clear to those skilled in the art that both branches could employ a variable resistance with separate control signals being provided to control the total resistance of each branch. Each branch would still have a minimum and maximum resistance determined by resistors, and minimum and maximum gain values would be set independently of the JFET characteristics.

Figure 9:
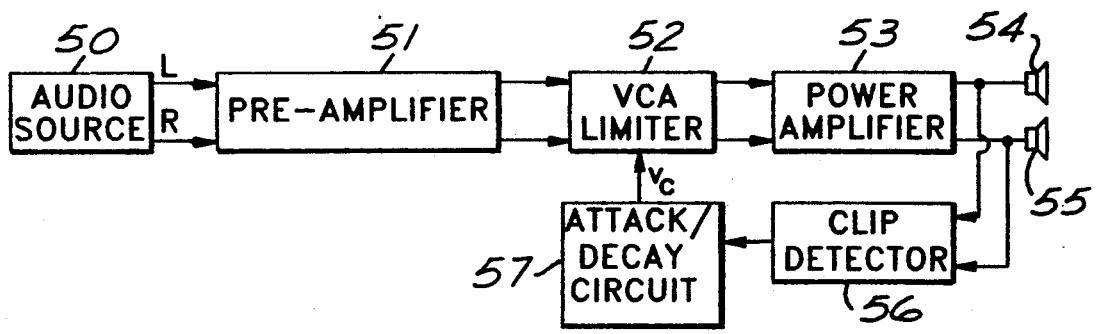
FIG. 9 is a block diagram showing an audio system using the multichannel audio limiter of the present invention.

A preferred use of the amplifier circuit of the present invention is in a multichannel audio limiting circuit as shown in FIG. 9. An audio source 50, such as a radio, a cassette deck, or a CD player, provides stereo signals to a preamplifier 51. Preamplified audio signals are provided from preamplifier 51 to a voltage controlled amplifier (VCA) 52 which in this case is an audio limiter. The limiter output is provided to a power amplifier 53 which drives stereo speakers 54 and 55. The power amplifier output is also provided to a clip detector 56 which detects the onset of clipping distortion in power amplifier 53. A clip signal is provided from clip detector 56 to an attack/decay circuit 57 which processes the clip signal to produce the control signal $v_c$ which is coupled to VCA limiter 52.

In the system of FIG. 9, Power amplifier 53 provides a fixed gain. Preamplifier 51 provides a variable gain in response to a manual volume command. In the event that an audio signal from audio source 50 multiplied by the gains provided by preamplifier 51 and power amplifier 53 result in a signal which is greater than the maximum voltage which can be supplied by power amplifier 53, clipping distortion results since the audio output signal provided to speakers 54 and 55 would deviate from its original shape. Limiter 52 solves this problem by providing a substantially fixed gain (e.g., equal to about one or any other fixed value) corresponding to its maximum gain whenever clipping is not detected. However, when clipping occurs, it is detected and the gain provided by limiter 52 is reduced so that the total gain provided by the system is less than the amount which causes clipping to occur. In order to minimize any distortion caused by rapidly changing the gain, attack-/decay circuit 57 controls the rate at which the limiter gain is first reduced and then restored to its original value.

In the system of FIG. 9, limiter action must be matched between separate channels of the audio signal in order to avoid introducing additional distortion. Thus, unless each channel receives the same gain at all times, the channels will be unbalanced (i.e., the stereo image will be distorted). Properly matched channels can be obtained using JFET-controlled op amps with gain limiting resistors as taught by the present invention.

Figure 10:
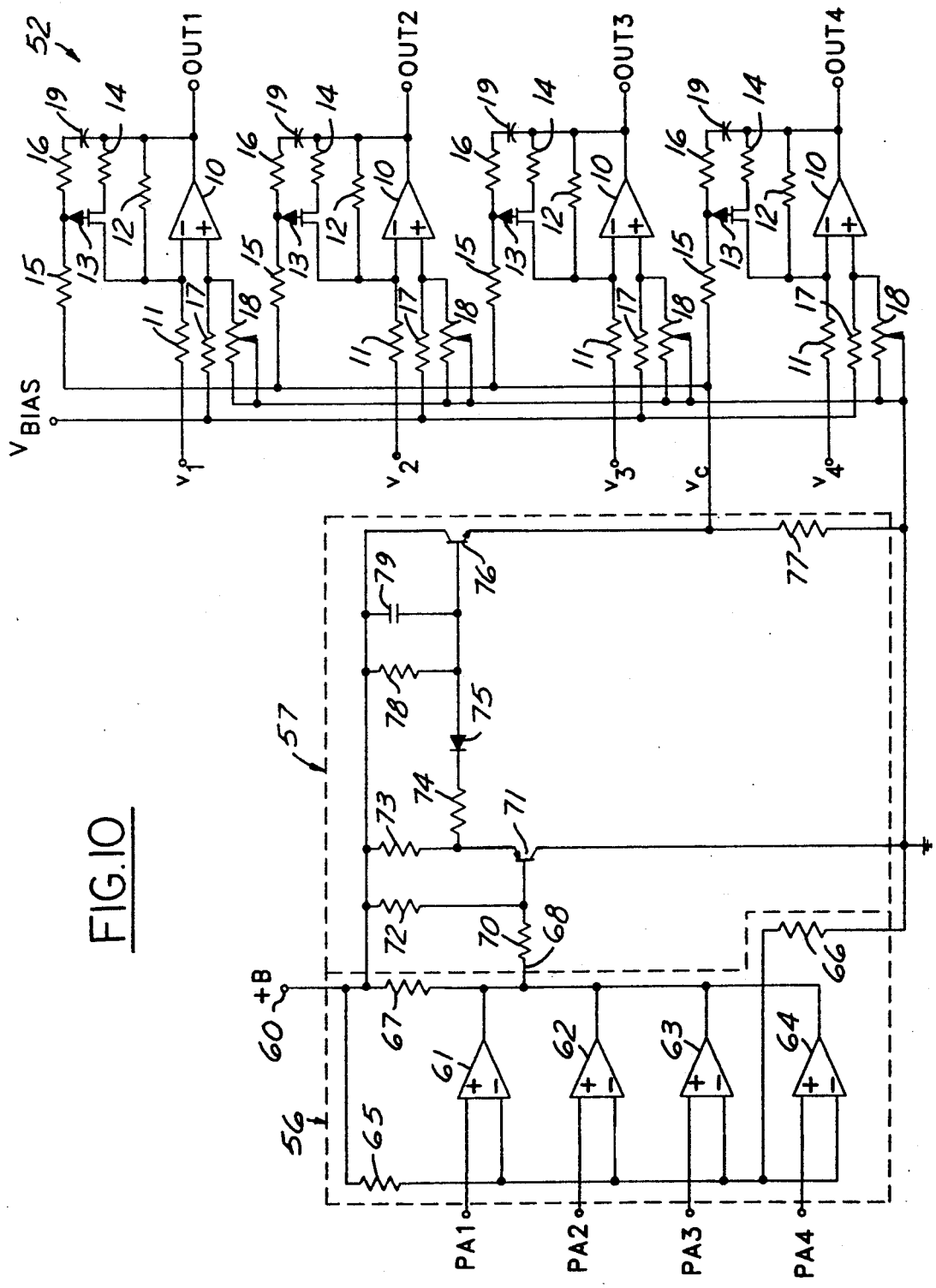
FIG. 10 is a schematic diagram showing a variation of the limiter system of FIG. 9 in greater detail.

FIG. 10 shows a four channel limiting system that is useful in an automotive audio system employing left-front, right-front, left-rear and right-rear channels. Thus, a VCA limiter 52 includes four channels, each of which is comprised of the inverting amplifier shown in FIG. 1 and interconnected as shown in FIG. 10. A first channel receives a preamplified signal $v_1$ and provides a limited output signal OUT1. Second, third and fourth channels receive Preamplified input signals $v_2$, $v_3$, and $v_4$ to produce output signals OUT2, OUT3, and OUT4, respectively. All four channels receive a common control signal $v_c$. Each op amp is biased by its respective voltage divider comprising resistor 17 and trim resistor 18 connected between a reference voltage $V_{BIAS}$ and ground. Each op amp is individually biased according to a voltage which insures that all JFETs from all channels are pinched-off at the same value of control signal $v_c$ even though their individual pinch-off voltages $V_p$ vary, as described in concurrently filed patent application Ser. No. 07/802,590, now U.S. Pat. No. 5,138,280.

FIG. 10 shows a clip detector circuit -6 which detects clipping whenever the output signal from any channel of the power amplifier exceeds a fixed percentage of the supply voltage. Thus, the power supply voltage is applied to a terminal 60. By way of example, a battery voltage +B is shown as would be available in an automotive system. Power amplifier output signals PA1, PA2, PA3, and PA4 from each respective channel of the power amplifier are provided to respective noninverting inputs of voltage comparators 61, 62, 63, and 64. A reference voltage obtained by a voltage divider comprising a resistor 65 and a resistor 66 connected between power supply voltage 60 and ground is provided to the inverting input of each respective voltage comparator 61-64. A pull-up resistor 67 is connected between power supply terminal 60 and the outputs of voltage comparators 61-64. Thus, the outputs of voltage comparators 61-64 are in a wired-OR configuration so that whenever the power amplifier output signal in any channel exceeds the reference voltage, clip detector 6 provides a high logic level output signal on a line 68 as a clip detect signal. Otherwise, a low logic level or ground signal is applied to clip signal line 68 by each voltage comparator.

In attack/decay circuit 57, line 68 is connected to a resistor 70 for coupling the clip detect signal to the base of a pnp transistor 71. The base of transistor 71 is further connected to the supply voltage +B through a resistor 72. Transistor 71 has its collector connected to ground and has its emitter coupled to the supply voltage through a resistor 73. The emitter of transistor 71 is further connected to one side of a resistor 74. The other side of resistor 74 is connected to the cathode of a diode 75. The anode of diode 75 is connected to the base of an npn transistor 76. The emitter of transistor 76 is coupled to ground through an emitter resistor 77 and provides the control signal $v_c$. Transistor 76 has a resistor 78 and a capacitor 79 coupled between its base and collector. The collector of transistor 76 is further connected to the supply voltage.

The circuit of FIG. 10 operates as follows. When no clipping is detected by clip detector 56, the voltage on clip signal line 68 is at ground. The resistance of resistor 72 is selected to be relatively greater than the resistance of resistor 70 so that the voltage applied to the base of transistor 71 is relatively low and the emitter of transistor 71 remains at a relatively high voltage to maintain diode 75 at a reverse bias. Thus, the base of transistor 76 receives the supply voltage through resistor 78 and is biased into conduction so that a relatively high control signal $v_c$ appears across resistor 77.

When clipping is detected in any channel of the power amplifier, the clip signal from voltage comparators 61-64 changes to a high value (i.e., equal to the supply voltage). This high voltage is applied to the base of transistor 71 through resistor 70 and turns on transistor 71 to a greater extent causing the voltage at its emitter to fall to a value near ground. Diode 75 becomes forward biased and brings the voltage at the base of transistor 76 to a low value. However, the RC network comprising resistor 78, capacitor 79, and resistor 74 provide a time constant at which the voltage applied to the base of transistor 76 may decay. If the severity of clipping is sufficient to keep transistor 71 turned on for a sufficient length of time, the base voltage of transistor 76 is decreased to a point where transistor 76 begins to conduct less current and the control signal $v_c$ is reduced. As a result, the gain provided by each channel of the limiting amplifier is reduced by an equal amount.

When clipping ceases, the clip signal is again at a low value and transistor 71 conducts only a small current. With diode 75 coming out of conduction, the base voltage for transistor 76 slowly rises as the RC network comprised of resistor 78 and capacitor 79 is recharged. Thus, control signal $v_c$ is gradually restored to a value greater than or equal to the pinch-off voltage of each of the JFETs.

In one preferred embodiment of the circuit shown in FIG. 10, each channel in the limiter circuit was provided with a maximum gain set by resistors 11 and 12 corresponding to about $-0.6$. Thus each channel was continually attenuated, with greater amounts of attenuation being applied during clipping. The minimum gain determined by resistors 11, 12, and 14 corresponded to about $-0.1$. Specifically, resistance values for the resistors were about 3.9 K ohms for resistor 11, 2.4 K ohms for resistor 12 and 470 ohms for resistor 14. Resistors 15 and 16 each had a value of about 1.2 megohms.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. An audio system comprising:
   multichannel limiter means for amplifying multichannel input signals by respective gains which are substantially equal and variable within a range less than or equal to a predetermined gain in response to a control signal to produce limited multichannel signals;

power amplifier means coupled to said multichannel limiter means for amplifying said limited multichannel signals each by a substantially fixed gain greater than one to produce multichannel output signals;

clip detector means coupled to said power amplifier means for producing a clip signal upon the occurrence of clipping in any of said multichannel output signals; and control means coupled to said clip detector means and said multichannel limiter means for producing said control signal, said control signal having a predetermined value in the absence of clipping which corresponds to said predetermined gain, said control means altering said control signal away from predetermined value according to a predetermined attack time in response to said clip signal and altering said control signal back to said predetermined value according to a predetermined decay time when said clip signal ceases;

wherein each channel of said multichannel limiter means comprises:

an operational amplifier having an inverting input, a noninverting input, and an output;

a first resistor having one end connected to said inverting input and having the other end connected to receive a respective multichannel input signal;

a second resistor connected between said inverting input and said output;

a third resistor; and a field-effect transistor having source and drain output terminals and a gate input terminal;

said source and drain output terminals being connected in series with said third resistor between said inverting input and said output.

2. The system of claim 1 wherein each channel of said multichannel limiter means further comprises variable bias means for providing a selectable bias voltage to said noninverting input to compensate for mismatching of said field-effect transistor between different channels.

3. The system of claim 1 wherein each channel of said multichannel limiter means further comprises a feedback resistor coupling said gate input terminal and said source output terminal to maintain said field-effect transistor in its linear resistance region of operation.

* * * * *